United States Patent [19]

Chan et al.

[11] Patent Number: 5,895,237
[45] Date of Patent: *Apr. 20, 1999

[54] NARROW ISOLATION OXIDE PROCESS

[75] Inventors: Tsiu Chiu Chan, Carrollton; Pervez H. Sagarwala, Grand Prairie, both of Tex.

[73] Assignee: STMicroelectronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/775,177

[22] Filed: Dec. 31, 1996

[51] Int. Cl.⁶ .......... H01L 21/8238; H01L 21/336
[52] U.S. Cl. .......... 438/225; 438/231; 438/297; 438/305
[58] Field of Search .......... 437/34, 44, 57, 437/69; 438/303, 225, 228, 297, 305, 231

[56] References Cited

U.S. PATENT DOCUMENTS 5,298,782  3/1994  Sundaresan ............ 257/393
5,523,250  6/1996  Jeong et al. ............ 437/44

OTHER PUBLICATIONS

Wolf, "Silicon Processing for the VLSI Era vol. 2: Process Integration", Lattice Press, pp. 327–331, 436–438, 1990.

Primary Examiner—Richard A. Booth
Attorney, Agent, or Firm—Theodore E. Galanthay; Lisa K. Jorgenson; Pete J. Thoma

[57] ABSTRACT

A high performance CMOS process using grown field oxide for active area isolation takes advantage of process steps used in LDD transistor fabrication to reduce the chip space occupied by the field oxide. Portions of the spacer oxide layer are retained intact over the field oxide during the etching step used to form the oxide spacers on the sides of the polysilicon gates. The retained spacer oxide portions increase the total oxide thickness in the field area to effectively block the ion implantation used to form the heavily doped portions of the source and drain regions. This enables use, in the initial fabrication steps, of a grown field oxide of reduced thickness and advantageously a correspondingly reduced width so as to reduce the chip space allocated to the field oxide.

20 Claims, 4 Drawing Sheets 5,895,237

NARROW ISOLATION OXIDE PROCESS

BACKGROUND OF THE INVENTION

The present invention relates generally to semiconductor manufacturing processes, and more particularly to oxide isolation processing techniques used in the fabrication of submicron geometry integrated circuit devices.

In the past two decades Very Large Scale Integration ("VLSI") process technologies have evolved from generation to generation with ever increasing chip packing densities and shrinking layout design rules. Fundamental to Integrated Circuit ("IC") device manufacturing is the fabrication of extremely large numbers of isolated active areas on the surface of a thumb-nail size chip of silicon, each active area typically being the site of one or more transistor elements. A single chip can contain in excess of one million transistors and many thousands of active areas. Of course, many such chips are fabricated side-by-side simultaneously as distinct but integral parts of a large silicon wafer. Present day fabrication facilities ("Fabs") are equipped to process eight-inch diameter wafers.

Prominent among the conventional process technologies in use today are various CMOS processes in which complementary P-channel and N-channel metal oxide semiconductor field effect transistors ("MOSFETs") are fabricated and interconnected on the same chip. State-of-the-art processes are now achieving feature sizes (e.g., gate widths) of slightly under 0.3 microns. The present invention is particularly applicable to such high performance CMOS processes, but may be useful as well in other conventional MOS processes.

A common feature of such MOS processes is the use of thick layers of silicon dioxide ("oxide") to isolate adjacent active areas on a silicon chip. In one common oxide isolation technique, thick ribbons of "field oxide" are grown in selected areas using standard masking techniques. Today's advanced process technologies rely upon a field oxide of a specified minimum thickness to block dopant penetration into the silicon underlying the field oxide during conventional ion implantation steps. Ion implantation is used to introduce dopants such as phosphorus and boron into the silicon to form transistor source and drain regions in the active areas. Penetration of the field oxide by such dopants would short out transistors in neighboring active areas, thus defeating the isolation function of the field oxide and effectively preventing the fabrication of operational IC devices.

Because a minimum thickness for the field oxide is required to prevent dopant penetration, the field oxide has become a limiting factor in achieving relatively high packing densities in submicron feature size processes. This problem is due in part to the inherent nature of oxide growth in which the oxide spreads laterally while growing on the silicon surface, producing a field oxide that is thicker in the middle than at the edges. The tapered portions on each side of the field oxide constitute "transition zones" that waste valuable silicon real estate.

One alternative has been to deposit the isolation oxide in an etched trench, which enables the fabrication of deep yet narrow oxide walls isolating adjacent active areas. However, this technique has its own particular set of fabrication and functionality problems.

Thus, it would be desirable to be able to employ a grown oxide as an isolation oxide with a relatively narrow width while maintaining sufficient oxide thickness in the field area to prevent dopant penetration during ion implantation.

In order to fully appreciate the improvement achieved by the present invention, the following description is provided with reference to FIGS. 1–5 showing the relevant steps in a prior art process using a grown field oxide.

Referring to FIG. 1, a small upper portion of an IC chip 10 is shown in cross section at an early stage in the fabrication process. The chip 10 includes a silicon substrate 12, which typically is lightly doped so that it can be readily counterdoped to enable the formation of transistor regions therein. For example, the substrate 12 may comprise 8 ohm-centimeter resistivity monocrystalline silicon. Alternatively, the substrate 12 may include a heavily doped lower portion (not shown) and a lightly doped epitaxial layer in its upper portion, which is illustrated in FIG. 1. In illustrating the substrate 12, cross-hatching has been left off for clarity.

In a CMOS process, wells of complementary conductivity are provided in the upper portion of the substrate. There are many such wells arranged to enable fabrication of very large numbers of P-channel and N-channel MOS transistors at discrete locations on the chip 10. In the example of a CMOS process, only the upper portion of one such well is shown in FIG. 1. Whether the well is N-type or P-type, the process steps as described below are substantially the same but with dopants of opposite conductivity types being used in corresponding regions of the opposite conductivity type wells. For simplicity, the description of FIGS. 1–5 will assume that the fabrication is occurring in a P-type well where an N-channel transistor is shown being formed. As used herein, "N-channel transistor" describes a MOSFET with N-type source and drain regions, and "P-channel transistor" describes a MOSFET with P-type source and drain regions.

A thin oxide layer 14 is provided on the chip 10, preferably by thermal oxidation of the top surface of the silicon substrate 12. For example, oxide layer 14 may be grown to a thickness of about 150 Å. Atop the oxide layer 14 are layers 16 and 17 of silicon nitride, which are derived from a single deposited nitride layer using a conventional photolithographic technique. Nitride layers 16 and 17 are two of many such layers used to define active areas in the upper portion of the substrate 12.

Present day photolithography employs a series of masking and chemical processing steps to form patterned layers in precise locations on the surface of a semiconductor substrate. The following is a general description of such commonly employed photolithography, which need not be illustrated because the techniques are well known. An image, which corresponds to one "die" or "chip" on a wafer containing many such individual chips, is contained in a "reticle," which is a type of optical plate. An ultraviolet ("UV") light is passed through the reticle and is optically reduced in size by a factor, such as a 5 to 1 reduction. The light is focused on the wafer in registration with one chip location and exposes a thin UV sensitive layer of photoresist, which has been deposited on the wafer. The light chemically alters the exposed portion of the photoresist. Following a development process, the unexposed portions of the photoresist can be removed chemically leaving a high resolution photoresist mask on the surface of the wafer. The exposure process is repeated through a stepping operation for each chip location prior to the development and selective removal steps. As those skilled in the art know well, precise registration of each photoresist mask in a series of such masking operations is necessary for achieving operational devices. As process technology has advanced, mask misalignment tolerances have tightened commensurate with each decrease in feature sizes, which are now well into the submicron range.

Referring to FIG. 2, an illustrative example of a top surface pattern is shown. In the small area of the silicon chip shown, the nitride layer 16 assumes a square shape. Nitride layer 17, which is only partially shown, may also be square or may be some other shape as layout needs dictate. An active area 18 is shown in FIG. 2 as the dashed square confined within the outline of the larger square nitride layer 16. The actual edges of the active area 18 are defined by a field oxide formed in subsequent processing. Thus, the dashed square is included in FIG. 2 merely to illustrate where the active area 18 will lie following the subsequent field oxide formation, which will now be described.

In FIG. 3, the portion of the silicon chip 10 is shown after a series of processing steps following the stage shown in FIG. 1. The principal step in the sequence is a thermal oxidation step for an extended duration, which initially grows silicon dioxide on the surface of the silicon chip in the areas not covered by nitride layers 16 and 17 and other such nitride layers not shown in the figure. As the thermal oxidation proceeds, oxide grows laterally under the edges of the silicon nitride layers, bending them upward in the process. This occurs due to oxygen penetrating laterally and downward through the thin oxide layer 14 under the edges of the nitride layers to the underlying silicon surface where the oxidation reaction occurs. The thermal oxidation step is halted when the growing oxide layer reaches a desired thickness (e.g., 4000 Å). Then, the nitride layers and the underlying thin oxide layer 14 are stripped away using conventional etching techniques to arrive at the structure depicted in FIG. 3.

After such conventional processing steps, a thick field oxide layer 20 is provided having the cross-sectional profile shown in FIG. 3. The field oxide 20 has tapered edge portions or transition zones T, which extend from a thick middle portion F to points defining the boundaries of the active areas. To provide a visual understanding of the top surface pattern, the transition zones T are shown as the shaded areas confined within the dashed outlines in FIG. 2. The pointed edges of the transition zones T define the boundaries of the active areas, such as the square active area 18. Typically, the width of each transition zone T approximately equals the maximum field oxide thickness, which in this case is about 4000 Å.

Now referring to FIG. 2a, a line chart is shown corresponding in location to the cross section line in FIG. 2. FIG. 2a shows the locations of the transition zones T, the full thickness field oxide portion F, and the active area 18, which is labeled A. FIG. 2a illustrates the fact that a relatively large portion of the silicon surface is allocated to the transition zones T.

Referring again to FIG. 3, a doped region 22 illustrated by stippling is present just below the field oxide 20. This doped region 22 is called a channel stop, and serves as the name implies to prevent unwanted inversion of the conductivity of the silicon just below the field oxide 20 during operation of the IC device. In the example of a P-type well, a gate interconnect layer (not shown) passing over the field oxide 20 could induce a conductive channel of electrons under the field oxide in much the same way as an N-channel MOSFET turns on. But for the channel stop, such an unwanted channelling effect under the field oxide might occur in the event that such an overlying gate interconnect layer carries a voltage transient above nominal gate levels. To prevent such unwanted channelling, the P-type doping is increased immediately under the field oxide 20. Typically, this is accomplished prior to growth of the field oxide by a boron ion implant step to introduce a relatively heavy dose of boron atoms into the portions of the silicon surface not covered by the nitride layers. See FIG. 1. Preferably, boron difluoride ($BF_2$) molecules are implanted through the thin oxide layer 14 while the relatively thick nitride layers 16, 17 are used to block the molecules penetration through to the underlying silicon.

Now referring to FIG. 4, the portion of the chip 10 undergoing processing is shown at a subsequent stage in the fabrication process. Steps leading to this stage include growth of a thin gate oxide layer 24, formation of a conductive polycrystalline silicon ("polysilicon") gate layer 26, and the deposition of a silicon dioxide layer 28 of about 1500 Å to 2000 Å in thickness over the entire surface of the chip 10. The thickness of the gate oxide layer 24 in present day high performance CMOS processes is under 100 Å and is typically about 70 Å for the most advanced processes. For conceptual clarity of illustration, the figures exaggerate the relative thickness of gate oxide layer 24. The polysilicon gate 26 is typically about 3000 Å thick (i.e., tall) and 3000 Å wide for such advanced processes.

Prior to deposition of oxide layer 28, lightly doped transistor regions 30 and 32 are formed by an ion implantation step. In the P-type well, the transistor being fabricated will be an N-channel MOSFET, in which case a dose of phosphorus ions is implanted in self-aligned registration with the gate 26. A typical dose would be $2 \times 10^{13}$ ions/cm$^2$ at an implant energy of 30 KeV. The N-type regions 30 and 32 thus formed are shown driven to a slight depth into the upper surface of the substrate 12, but in reality such a drive step does not occur until a later stage in the process. Once driven, the lightly doped regions 30 and 32 will extend slightly under the edges of the gate 26 and define a channel therebetween. For a gate of 0.3 microns (i.e., 3000 Å), the channel length would of course be slightly less than 0.3 microns due to the lateral diffusion of regions 30 and 32 slightly under the gate 26.

As a result of a number of conventional etching and cleaning steps performed between the stages of FIGS. 3 and 4, the shape and thickness of the field oxide 20 has changed. The maximum thickness in the center of the field oxide has been diminished from about 4000 Å to less than 3000 Å and perhaps as little as 2500 Å. Also, the contour of the top surface of each of the transition zones T has changed from a generally convex shape to a concave shape sometimes referred to as a "bird's beak" characteristic.

Now referring to FIG. 5, the chip 10 is shown following partial removal of oxide layer 28 and an additional ion implantation step. Using a conventional anisotropic etching step, the oxide layer 28 of FIG. 4 is substantially removed except for oxide spacers 34 and 36 as shown in FIG. 5. As deposited, the oxide layer 28 conforms with a fairly uniform thickness to the surfaces of the underlying structure. Thus, when oxide layer 28 is removed by anisotropic etching, it comes off at a relatively constant vertical rate. Applying this phenomenon to advantage, the etch can be stopped when all portions of layer 28 except for the oxide spacers 34 and 36 have been removed. In practice, the anisotropic etch is stopped just after the oxide clears from atop the polysilicon layer 26 at a point when portions of the gate oxide 24 adjacent to the field oxide 20 have also been etched away to expose the underlying silicon surface of the substrate 12.

Then, for the N-channel transistor example shown, a relatively heavy phosphorus ion implantation step is performed to provide heavily doped regions 38 and 40. Preferably, a double implant is used in which phosphorus and arsenic atoms are implanted in successive steps, both being N-type dopants but with different atomic weights. A typical phosphorus dose would be $5 \times 10^{14}$ ions/cm$^2$ at an implant energy of 30 KeV, and a typical arsenic dose would be $5\times10^{15}$ ions/cm$^2$ at an implant energy of 30 KeV. In the final device after a drive-in procedure has been performed, the phosphorus defines the PN junction depth at about 700 Å below the surface, while the arsenic reaches a maximum depth of about 300 Å. The very high arsenic doping concentration (at about the solubility limit in silicon) provides a very low resistivity in the N-type source and drain regions. The junction-defining phosphorus dopants achieve a relatively low leakage current by keeping the depletion layer (i.e., the layer that is depleted of charge on opposite sides of the PN junction during operation) from reaching the arsenic-doped region under normal operating voltage conditions.

The heavily doped regions 38 and 40 overlap the respective lightly doped regions 30 and 32, so that there is effectively only one source region (e.g., combined regions 30 and 38) and one drain region (e.g., combined regions 32 and 40) for each transistor. This technique has become standard in current practice in the fabrication of MOS integrated circuits and has become known as the lightly doped drain ("LDD") process. As those skilled in the art will appreciate, the LDD process is employed to provide MOSFETs having higher gains and other performance improvements relative to transistors having uniformly doped source and drain regions characteristic of processes used in years past. It will also be appreciated that in CMOS devices, P-channel LDD transistors are formed in the N-type wells using a similar sequence of steps in which light and heavy doses of boron are implanted to form the source and drain regions.

Although FIG. 5 shows a depth distinction between the lightly doped and heavily doped portions of the source and drain regions, they are depicted in this way merely to facilitate an understanding of the doping concentration differentiations. In actual practice the depths of the lightly doped and heavily doped portions may be indistinguishable, both extending to a depth from about 500 Å to about 700 Å below the silicon surface. Also, this final PN junction depth in not reached until after the aforemention drive-in procedure has been performed. The drive-in procedure preferably is performed as part of an oxide "reflow" procedure in which subsequently deposited oxide layers (not shown) are heated to a relatively high temperature, which substantially smoothes out the surface irregularities caused by the patterns of underlying conductive and insulating layers.

It will be appreciated that the above described process requires a final oxide thickness of at least about 2500 Å in the middle portion of the field oxide 20 to block the heavy ion implantation dose used to create the heavily doped portions 38 and 40 of the source and drain regions shown in FIG. 5. Since the field oxide 20 is reduced in thickness as a consequence of standard etching and cleaning steps in the course of processing, it has been standard practice to start with about 4000 Å of oxide as depicted in FIG. 3 to assure a minimum of 2500 Å of oxide when the heavy ion implantation dose is applied at the stage of FIG. 5. Because the formation of a 4000 Å thick field oxide layer 20 as shown in FIG. 3 produces relatively wide transition zones T by lateral oxide growth, this technique has been viewed as relatively inefficient in chip area utilization, particularly in state-of-the-art submicron processes.

SUMMARY OF THE INVENTION

In accordance with the present invention, an oxide layer used to define LDD spacer oxide walls on the sides of polysilicon gates is retained over a field oxide layer in order to block penetration of the field oxide by ions implanted during formation of transistor source and drain regions in the device. The field oxide layer, which is used to isolate adjacent active areas, is grown to minimum width and thickness dimensions relying on the spacer oxide layer to increase the total oxide thickness as needed without increasing the width dimension.

When used in submicron gate width fabrication processes, the present invention enables a substantial reduction in the chip area devoted to the isolation oxide. A much narrower field oxide can be grown by subsequently employing portions of the deposited spacer oxide layer to increase the total oxide thickness in the field area to a thickness sufficient to block heavy dose LDD transistor implants.

When applied in a CMOS process, the present invention uses a single critical mask to define a spacer oxide pattern conforming to the narrow field oxide pattern in both conductivity type wells of the device.

The novel features believed characteristic of the invention are set for in the appended claims. The nature of the invention, however, as well as its features and advantages, may be understood more fully upon consideration of an illustrative embodiment, when read in conjunction with the accompanying drawings, wherein:

DESCRIPTION OF THE PREFERRED EMBODIMENTS

FIGS. 6–11 depict process steps which are similar to those described above in conjunction with FIGS. 1–5, the differences showing the improvement made over the prior art process. Where elements in FIGS. 6–11 are similar to (but not necessarily the same as) those in the prior art FIGS. 1–5, they are designated by similar numerals (i.e., adding 100).

Figure 6:
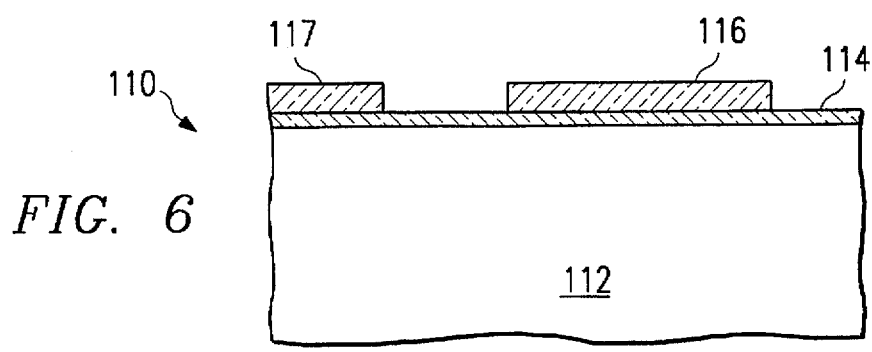
FIG. 6 is a schematic cross-section illustrating a portion of a semiconductor device being fabricated in accordance with a process of the present invention at a stage corresponding to that of FIG. 1.

Referring in particular to FIG. 6, a portion of a semiconductor chip 110 is shown and includes a substrate 112, an oxide layer 114 and nitride layers 116 and 117. The portion of the substrate 112 shown is, by way of example, an upper portion of a lightly doped P-type well of a CMOS integrated circuit device. It will be understood that many other such P-type wells as well as many N-type wells are included in the device and undergo similar processing. Nitride layers 116 and 117 are formed much like their counterparts in FIG. 1, but are somewhat smaller in area and are spaced closer together.

Figure 7:
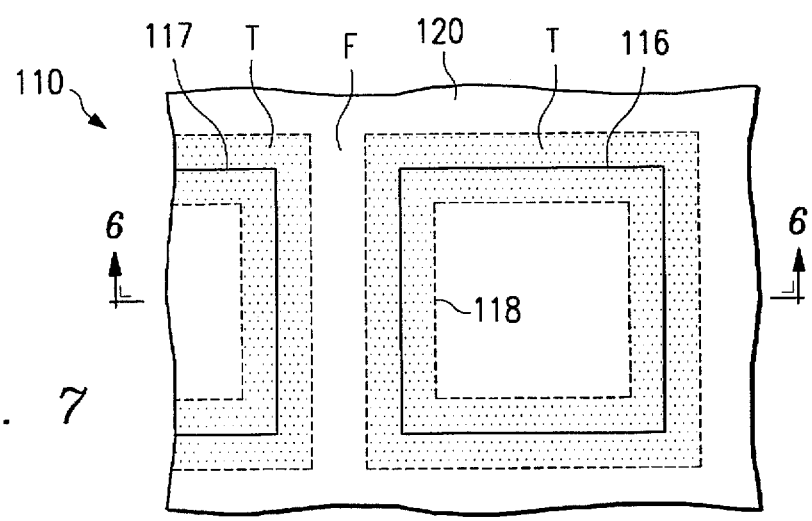
FIG. 7 is a schematic plan view of a portion of the device of FIG. 6 with added shaded portions identifying areas defined by structures fabricated in subsequent processing steps.
Figure 8:
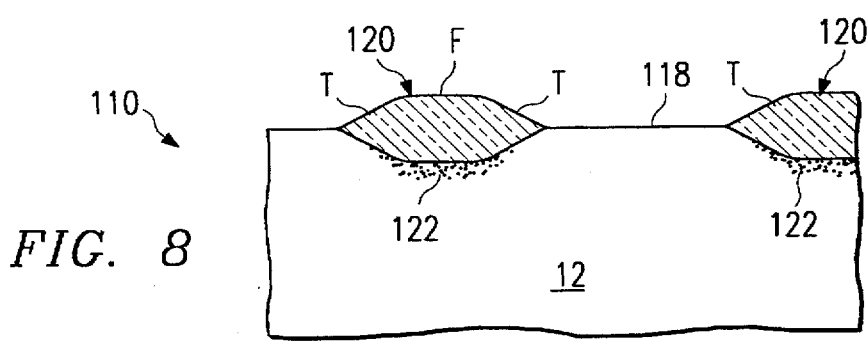
FIGS. 8–11 are schematic cross-sections illustrating the portion of the device depicted in FIG. 6 at various subsequent stages in the process.

Referring to FIGS. 7 and 8, an active area 118 is defined by the edges of a field oxide layer 120. The field oxide layer 20 is grown by thermal oxidation of the portions of the substrate 112 not covered by the nitride layers 116 and 117 (and other such nitride layers not shown in the figures). The field oxide layer 120 also grows slightly under the edges of the nitride layers producing tapered edge portions or transition zones T. In the improved process of the present invention, the field oxide layer 120 is grown to a thickness of about 2500 Å in the middle portion F between the tapered transition zones T.

Figure 7A:
FIG. 7a is a line graph along the same line of the section indicated in FIG. 7.

Referring to FIG. 7a, the line graph depicts the relative amounts of surface area occupied by the field oxide 120 and the active area 118. The line graph shows the location of the transition zones T. The full thickness portion of the field oxide 120 designated by the letter F, and the active area 118 designated by the letter A.

Figure 1:
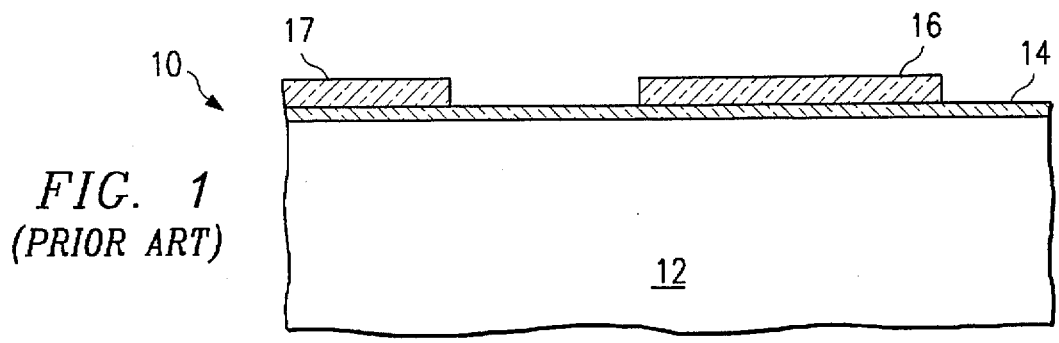
FIG. 1 is a schematic cross-section illustrating a portion of a semiconductor device at an early stage in a prior art process.
Figure 2:
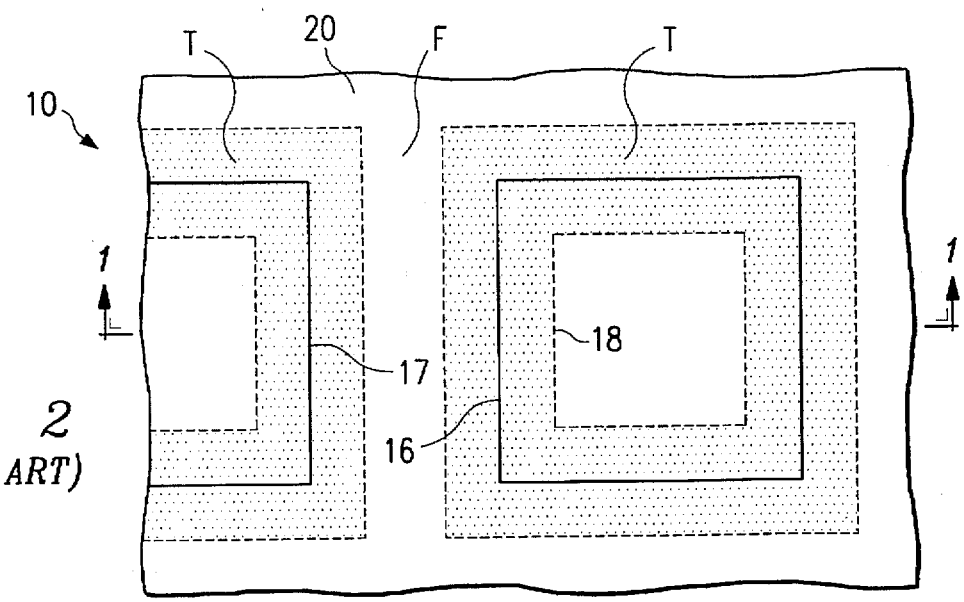
FIG. 2 is a schematic plan view of a portion of the device of FIG. 1 with added shaded portions identifying areas defined by structures fabricated in subsequent processing steps.
Figure 2A:
FIG. 2a is a line graph along the same line of the section indicated in FIG. 2.
Figure 3:
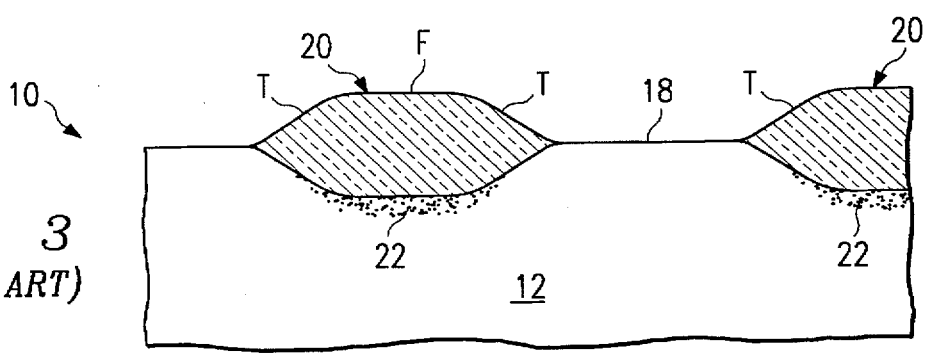
FIGS. 3–5 are schematic cross-sections illustrating the portion of the device depicted in FIG. 1 at various subsequent stages in the process.
Figure 4:
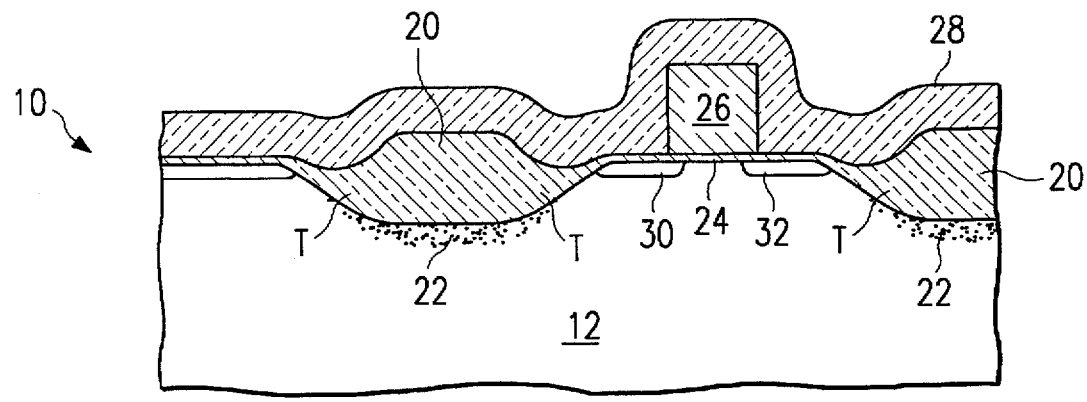
Figure 5:
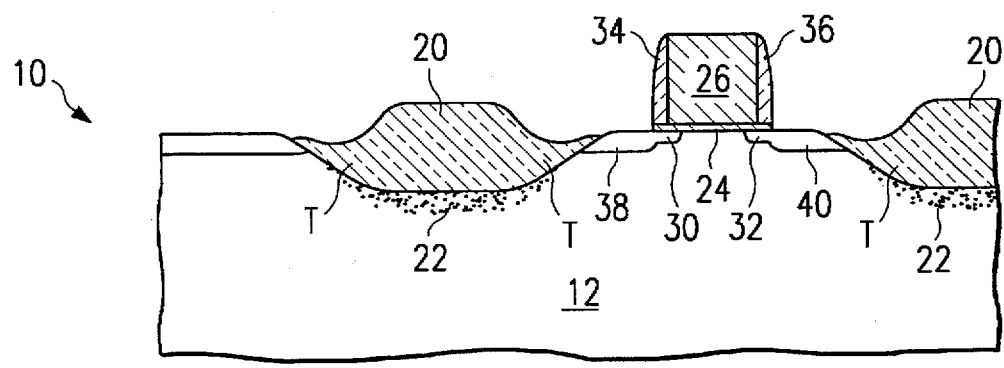

The portions of the chip surface occupied by the transition zones T are the shaded portions defined within the dashed outlines shown in FIG. 7. A comparison of FIG. 7 to FIG. 2 shows that reducing the maximum thickness of the field oxide from 4000 Å to 2500 Å greatly reduces the amount of chip area devoted to the transition zones T, while the active areas 18 and 118 can remain the same size. Reducing the maximum field oxide thickness to 2500 Å reduces the width of each transition zone T to about 2500 Å.

Figure 9:
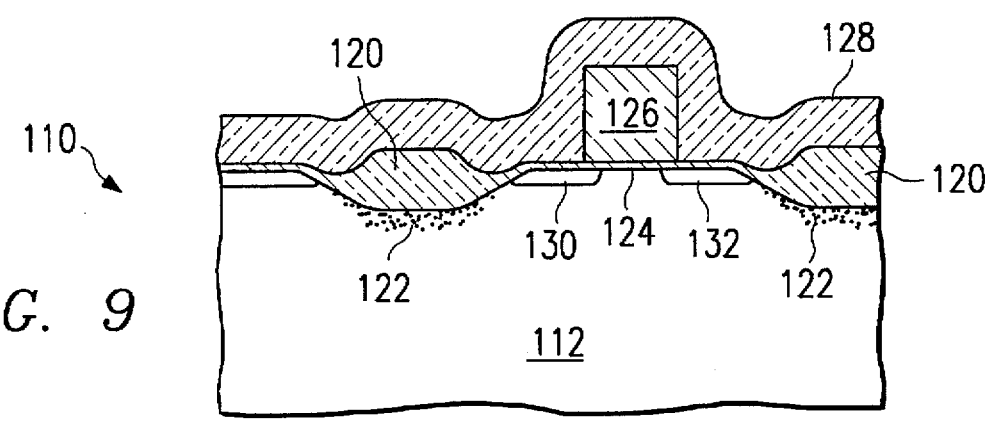

Referring to FIG. 9, the structure is shown at a stage corresponding to that which has been described previously in connection with FIG. 4, except that the size of the field oxide is smaller. Due to conventional etching and cleaning steps, the thickness of the field oxide 120 has been reduced to 1600 Å ±100 Å in the thick middle portion. At the stage in FIG. 9, the gate oxide 124 has been formed and the polysilicon gate 126 patterned thereover. Also, lightly doped transistor regions 130 and 132 have been implanted, and a 1500 Å thick spacer oxide layer 128 has been deposited.

Since the lightly doped regions 130 and 132 are implanted prior to deposition of the spacer oxide layer 128, the field oxide 120 alone at this stage must be able to effectively block penetration by the impinging dopant ions through to the portion of the substrate 112 underlying the thick middle portion of the field oxide. Therefore, knowing the degree of reduction in thickness that the field oxide 120 will undergo in the course of processing, the field oxide is initially grown to a thickness such that a minimum thickness sufficient to block the light dose LDD implant will remain on the chip at that stage. With the preferred light doses used, an initial thickness of 2500 Å is grown to provide an oxide of at least about 1500 Å thick, which is sufficient to block the implant.

Figure 10:
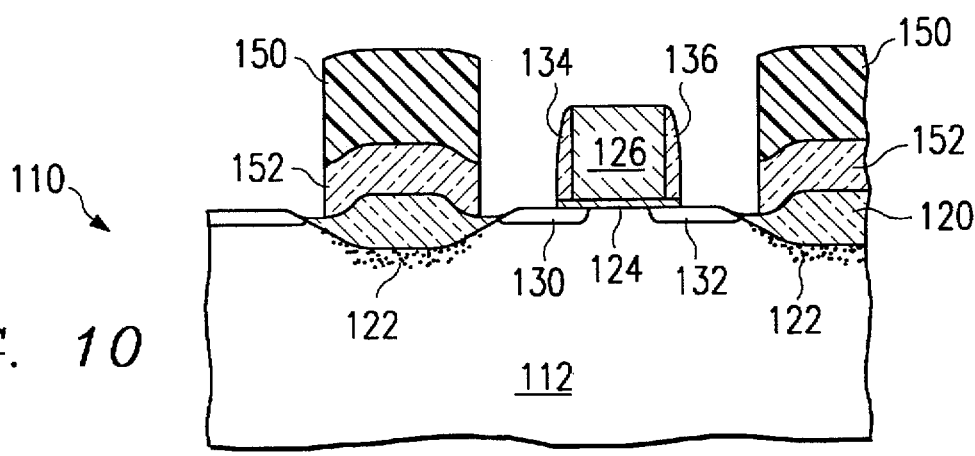

Now referring to FIG. 10, an aspect of the inventive process that enables narrowing of the field oxide will be described. A photoresist layer is formed atop the spacer oxide layer 128 and then patterned using conventional photolithographic techniques to provide a resulting patterned resist layer 150 substantially as shown. The patterned resist layer 150 lies over the field oxide layer 120 and approximately corresponds in location to the surface areas of the chip 110 that were not covered by the nitride layers described previously in conjunction with FIGS. 6 and 7. In other words, as will be appreciated by those skilled in the art, the resist layer 150 is patterned to provide a mask that is essentially the reverse of the active area mask used to define the nitride layer pattern.

With the patterned resist layer 150 in place atop the spacer oxide layer 128, the structure is subjected to an anisotropic etching step in order to fabricate oxide spacers 134 and 136 in a manner similar to the standard LDD process previously described. However, with the patterned resist layer 150 in place, the underlying portion of the spacer oxide layer 128 is preserved intact as designated by reference numeral 152.

Figure 11:
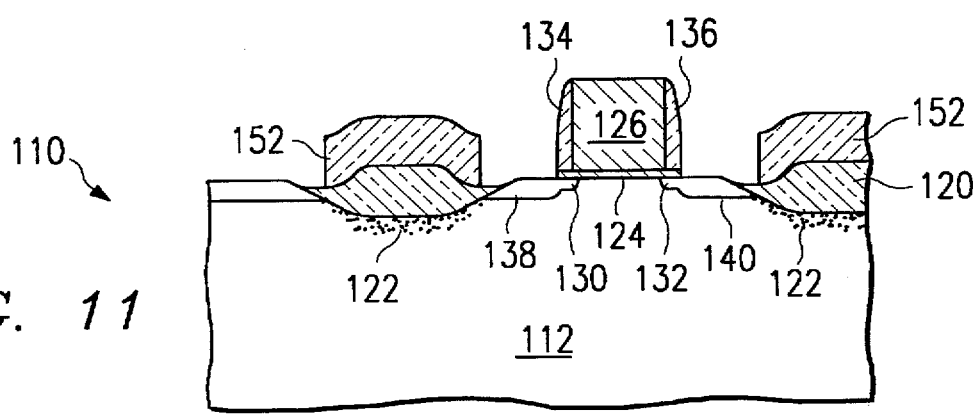

Now referring to FIG. 11, the patterned resist layer 150 is removed by conventional processing. Then, a heavy dose ion implantation step is performed to produce heavily doped regions 138 and 140. Again, as in the prior art process, preferably both phosphorus and arsenic ion implantations can be performed to produce the heavily doped regions 138 and 140. Since the oxide layer 152 has a thickness of about 1500 Å, the overall minimum thickness of the combined oxide layers 120 and 152 is about 3000 Å, which is more than enough to prevent penetration by the heavy ion implantation dose (or doses) used to form doped regions 138 and 140. It will be appreciated that the lightly doped regions 130 and 132 previously implanted and the heavily doped regions 138 and 140 are simultaneously driven into the silicon to their final depths during the same drive-in step. Although FIG. 11 shows these regions already at roughly the correct post drive-in depth, the drive-in occurs later, preferably coincident with a reflow procedure, as described below.

As depicted in FIG. 11, the oxide layer portions 152 overlying the field oxide 120 have substantially vertical edges and relatively sharp corners. In order to smooth out the chip topology, the following procedures are performed, along with the formation of various conductive interconnecting layers. Since they are conventional procedures well known in the art, the resulting structures are not illustrated. An undoped silicon dioxide layer is deposited to a thickness of about 2000 Å. A spin-on glass operation is then performed followed by deposition of a doped silicon dioxide layer (e.g., preferably doped with both phosphorus and boron). Then an oxide reflow is performed preferably at a temperature from about 800° C. to about 850° C. for about 20 minutes. The effect of these procedures is to provide a relatively smooth glass-like insulating layer over the device. As previously mentioned, the implanted dopants of the source and drain regions are driven into the silicon during the relatively high temperature reflow procedure. The drive-in not only establishes the desired source and drain junction depths, it activates the dopant atoms in the silicon so that the charges that they contribute become mobile carriers.

Standard processing steps follow the stage shown in FIG. 11 and provide conductive layers and further insulating layers at appropriate levels and patterns in order to provide an operational integrated circuit device. For example, a second polysilicon layer and an aluminum layer with interposed insulating layers can be used to interconnect transistor regions and gates with each other and to peripheral bonding pads used to communicate with circuitry external to the integrated circuit device. The insulating layers are selectively etched where needed to provide vertical conduction paths or "vias" to underlying conductive layers and transistor regions.

It will be appreciated that reducing the initial thickness of the field oxide 120 to 2500 Å compared to a 4000 Å thick field oxide 20 typical of the prior art process also enables a reduction in the width of the field oxide from about 11,000

Å to about 7000 Å. In other words, by employing a portion of the spacer oxide layer to assist in blocking the heavy source/drain implant, the width of the field oxide can be reduced appreciably, thereby saving substantial chip surface area. As the preceding description shows, the prior art process typically required a field oxide having a width exceeding 3.5 times the gate width. By contrast, the improved process of the present invention enables use of a field oxide having width that is less than 2.5 times the gate width. Using this technique, chip layouts can be redesigned more efficiently without sacrificing functionality, thereby achieving significantly greater packing density without resorting to fundamental changes in process technology.

An advantage of the improved process of the present invention is realized in fabricating CMOS devices. A single reticle exposure is used to define the patterned resist layer 150 in both the N-type wells and the P-type wells. The underlying portions 152 of the spacer oxide layer 128 that are left intact following the anisotropic etch step cover the field oxide 120 throughout the device in both the N-type and P-type wells. Thus, only one critical mask alignment is required to enable blocking of both the heavy N-channel and heavy P-channel ion implantations. During these successive N-type and P-type ion implantation operations, the wells not undergoing implantation are covered with patterned resist layers (not shown) that need not be positioned with the same tight alignment tolerance applied to the alignment of patterned resist layer 150. Those skilled in the art will appreciate the advantage of this feature in view of the demanding alignment tolerances associated with state-of-the-art submicron processes.

Although a preferred embodiment of the invention has been described in detail, it is to be understood that various changes, substitutions and alterations can be made therein without departing from the spirit and scope of the invention as defined by the appended claims.

What is claimed is:

1. In a process for fabricating submicron geometry semiconductor devices using field oxide isolation to define at least one active area surrounded by field oxide, the field oxide including a middle portion and tapered edge portions, and in which MOS transistors are formed using a spacer oxide layer to define spacer oxide walls adjacent to polysilicon gates, the process steps comprising:

(a) anisotropically etching the spacer oxide layer to define the spacer oxide walls while preventing etching of portions of the spacer oxide layer lying over the field oxide to retain said portions intact, the etching laterally confining said retained oxide portions above at least the entire width of the middle portion the field oxide;

(b) implanting dopants to form source and drain regions while blocking the implantation of dopants through the middle portion of the field oxide using said retained oxide portions of the spacer oxide layer; and (c) interconnecting transistor regions to form a functional device.

2. The process of claim 1 as applied in making CMOS integrated circuit devices wherein:

step (a) is performed to form spacer oxide wall adjacent to polysilicon gates for both N-channel and P-channel transistors and to leave portions of the spacer oxide layer intact over the field oxide within areas that define both N-type wells and P-type wells; and step (b) is repeated to successively implant N-type dopants in the P-type wells and P-type dopants in the N-type wells.

3. The process of claim 2, wherein the N-type implant is performed into exposed P-type wells while a first patterned resist layer covers the N-type wells, and the P-type implant is performed into exposed N-type wells while a second patterned resist layer covers the P-type wells.

4. The process of claim 3, wherein the N-type implant comprises a double implant of phosphorus at a dose of about $2\times10^{14}$ ions/cm$^2$ and arsenic at a dose of about $5\times10^{15}$ ions/cm$^2$.

5. The process of claim 2 wherein the field oxide has a lateral width of about 7000 Å and a final thickness of about 1600 Å.

6. The process of claim 5 wherein the spacer oxide layer has a thickness of about 1500 Å so that the combined oxide thickness of the spacer oxide layer and the underlying field oxide during the implant steps exceeds 3000 Å.

7. A semiconductor fabrication process comprising:

providing a semiconductor substrate;

growing a patterned field oxide to define active areas in an upper surface portion of the substrate, the field oxide having a middle portion and tapered edge portions;

forming LDD transistors with polysilicon gates in the active areas using a first dose ion implantation followed by a second dose ion implantation, the second dose exceeding the first dose;

after the first dose ion implantation and prior to the second dose ion implantation, anisotropically etching a spacer oxide layer to form spacer oxide walls adjacent to the polysilicon gates retaining portions of the spacer oxide layer intact over the patterned field oxide to prevent the second dose ion implantation from penetrating the field oxide, the etching laterally confining said retained oxide portions above the field oxide, said retained oxide portions extending from the tapered edge portions entirely across the middle portion of the field oxide.

8. The process of claim 7 wherein the LDD transistors are formed by steps comprising:

(a) growing a gate oxide in the active areas;

(b) forming polysilicon gate strips to define the polysilicon gates in the active areas;

(c) performing the first dose ion implantation step using the polysilicon gate strips to block implantation into the underlying substrate portions, the ion implantation step providing doped regions defining channels of the LDD transistors therebetween, the doped regions defining PN junctions in the active areas, whereby the portions of the PN junctions that define the channels will be self-aligned with respect to the edges of the polysilicon gate strips;

(d) depositing the spacer oxide layer;

(e) forming a photoresist mask on the spacer oxide layer overlying and conforming to the pattern of the patterned field oxide;

(f) performing the anisotropic etching step;

(g) removing the photoresist mask; and (h) performing the second dose ion implantation step to define source and drain regions of the LDD transistors in the active areas.

9. The process of claim 8 wherein the width of the field oxide is less than 2.5 times the width of the polysilicon gate strips.

10. The process of claim 9 wherein the field oxide is grown to an original maximum thickness in the thickest portions thereof of about 2500 Å, and subsequent processing steps reduce the maximum thickness to about 1600 Å.

11. The process of claim 10 wherein the width of the polysilicon gate strips is equal to about 3000 Å.

12. The process of claim 8 wherein a CMOS integrated circuit device is fabricated, and wherein steps (c) and (h) are repeated but using opposite conductivity type dopants to define both N-channel and P-channel transistors.

13. The process of claim 12 wherein submicron gate width transistors are formed, and wherein the width of the field oxide between adjacent active areas is less than 2.5 times the gate width.

14. A semiconductor process for fabricating a CMOS integrated circuit device, comprising:

forming P-type and N-type wells in an upper silicon surface portion of a semiconductor substrate;

growing a field oxide in a pattern to define active areas within the wells, the field oxide having a middle portion and tapered edge portions;

growing gate oxide layers in the active areas, the gate oxide being thinner than the middle portion of the field oxide;

depositing a polysilicon layer overlying the field oxide and gate oxide layers;

selectively removing portions of the polysilicon layer to define polysilicon gates in the active areas, the polysilicon gates having a submicron gate width;

selectively implanting a first dose of N-type dopants in the P-type wells and a first dose of P-type dopants in the N-type wells;

depositing a spacer oxide layer;

forming a patterned resist layer on the spacer oxide layer corresponding to the pattern of the field oxide;

anisotropically etching the spacer oxide layer for a duration sufficient to reach the top surface of the polysilicon gates and surface portions of the substrate while leaving spacer oxide walls adjacent to the polysilicon gates and retaining portions of the spacer oxide layer intact under the patterned resist layer, the etching laterally confining said retained oxide portions above the field oxide, said retained oxide portions extending from the tapered edge portions entirely across the middle portion of the field oxide;

removing the patterned resist layer;

selectively implanting a second dose of N-type dopants in the P-type wells and a second dose of P-type dopants in the N-type wells using said retained oxide portions overlying the field oxide to block the implantation of dopants into the silicon portions underlying the field oxide; and forming interconnections among active areas to provide a functional integrated circuit device.

15. The process of claim 14 wherein the width of the field oxide separating adjacent active areas is less than 2.5 times the gate width.

16. The process of claim 15 wherein the middle portion of the field oxide as initially grown is thinner than the gate width.

17. The process of claim 16 wherein the middle portion of the filled oxide as initially grown is about 2500 Å thick and is reduced in subsequent process steps to a thickness of about 1600 Å.

18. The process of claim 15 wherein the thickness of the spacer oxide layer is from about one-half to about two-thirds the dimension of the gate width.

19. The process of claim 18 wherein the thickness of the spacer oxide layer is from about 1500 Å to about 2000 Å.

20. The process of claim 15 wherein the thickness of the combined spacer oxide layer atop the field oxide layer used to block the implantation of the second doses of dopants is greater than 3000 Å.

* * * * *